(12) United States Patent
Jia et al.

(10) Patent No.: US 7,878,842 B2
(45) Date of Patent: Feb. 1, 2011

(54) BUSBAR DEVICE AND CIRCUIT BOARD HAVING THE SAME

(75) Inventors: Gongxian Jia, Schenzhen (CN); Guodong Zhang, Shenzhen (CN); Chunxing Huang, Shenzhen (CN); Lun Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 12/338,109

(22) Filed: Dec. 18, 2008

(65) Prior Publication Data

US 2009/0111303 A1 Apr. 30, 2009

Related U.S. Application Data

(63) Continuation of application No. PCT/CN2007/002087, filed on Jul. 6, 2007.

(30) Foreign Application Priority Data

Jul. 6, 2006 (CN) .......................... 2006 2 0124642

(51) Int. Cl.
*H01R 12/24* (2006.01)
(52) U.S. Cl. ..................... 439/493; 439/260
(58) Field of Classification Search ................. 439/493, 439/260
See application file for complete search history.

(56) References Cited

U.S. PATENT DOCUMENTS 4,130,934 A * 12/1978 Asick et al. .................. 29/882
5,267,876 A * 12/1993 Rupert et al. ............. 439/541.5
5,325,267 A * 6/1994 Ewing ......................... 361/760
5,367,764 A * 11/1994 DiStefano et al. ............. 29/830
5,584,704 A * 12/1996 Romann et al. .............. 439/130
5,752,851 A * 5/1998 Zaderej et al. ............... 439/493
6,089,881 A    7/2000 Daoud
6,238,225 B1   5/2001 Middlehurst et al.
6,327,157 B1   12/2001 Mann et al.
7,241,173 B2 * 7/2007 Callahan et al. .............. 439/579
2003/0040215 A1  2/2003 Kleen

FOREIGN PATENT DOCUMENTS

| CN | 2497457 Y | 6/2002 |
| CN | 1901101 A | 1/2007 |
| DE | 1962067 U | 6/1967 |
| EP | 1 087 300 A2 | 3/2001 |
| FR | 2729043 A1 | 12/1994 |
| JP | 2006-246594 A | 9/2006 |

OTHER PUBLICATIONS

Extended European Search Report in corresponding European Patent Application No. 07763995.3 (Jul. 28, 2010).
Written Opinion of the International Searching Authority in corresponding PCT Patent Application No. PCT/CN2007/002087 (Jul. 6, 2006).

* cited by examiner

*Primary Examiner*—Truc T Nguyen
(74) *Attorney, Agent, or Firm*—Leydig, Voit & Mayer, Ltd.

(57) ABSTRACT

A busbar device includes a conductive body. The conductive body is provided with a number of mounting holes corresponding to the mounting holes of a mount device for mounting the busbar device. The conductive body is a flexible conductive body, and the distance between every two adjacent mounting holes in the conductive body is larger than or equal to the distance between two corresponding adjacent mounting holes in the mount device.

9 Claims, 6 Drawing Sheets

BUSBAR DEVICE AND CIRCUIT BOARD HAVING THE SAME

CROSS-REFERENCE TO RELATED APPLICATIONS

This application is a continuation of International Patent Application No. PCT/CN2007/002087, filed Jul. 6, 2007, which claims priority to Chinese Patent Application No. 200620124642.3, filed Jul. 6, 2006, both of which are hereby incorporated by reference in their entirety.

TECHNICAL FIELD OF THE INVENTION

The present invention relates to a technology of providing large current for PCB (Printed Circuit Board), in particular, to a busbar device and a PCB having the busbar device.

BACKGROUND OF THE INVENTION

In the communication systems, computers, or servers, the backplane is an important component providing some functions, such as signal interconnection channels, power supply, or guidance and physical support, for various circuit boards. The backplane typically includes multilayer PCB, signal/power connectors, and guiding mechanism, etc. The multilayer PCB includes multiple layers of integral or bulk copper sheets having certain thickness and functioning as power supply and grounding reference, printed copper wires for providing interconnection channels for signals between the circuit boards, and insulation dielectric.

Figure 1:
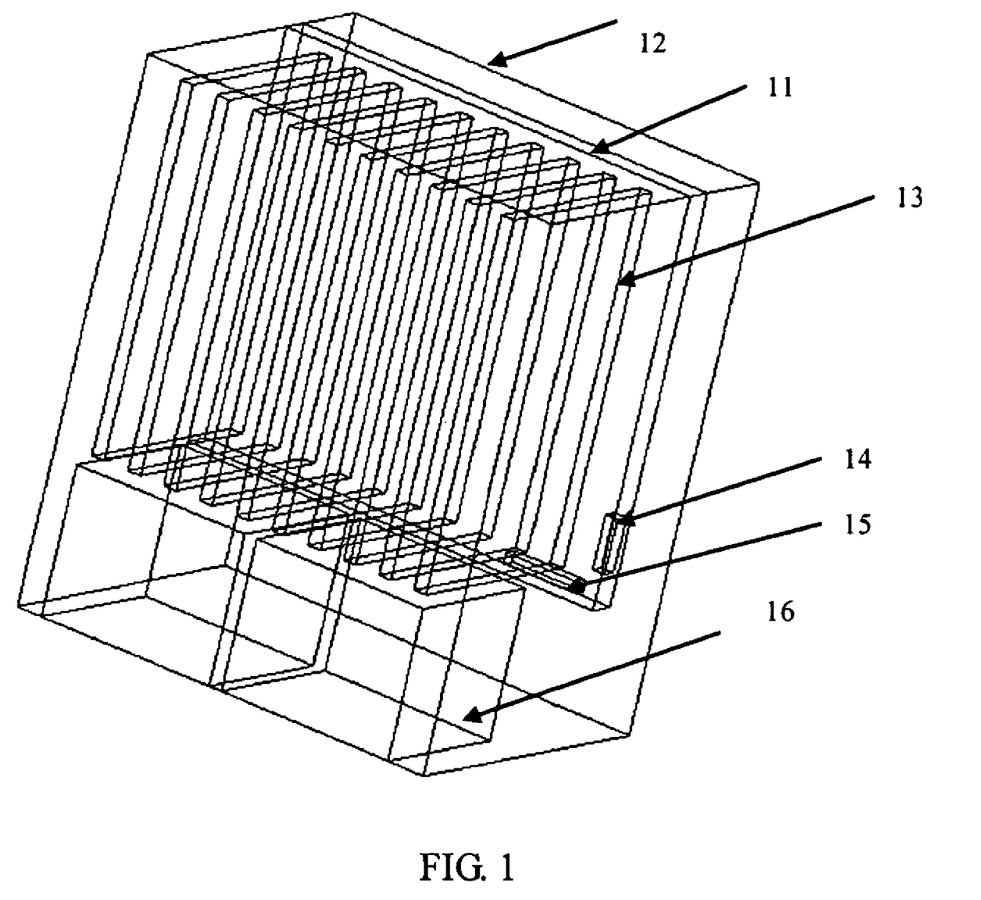
FIG. 1 is a structural schematic view showing a frame of the system.
Figure 2:
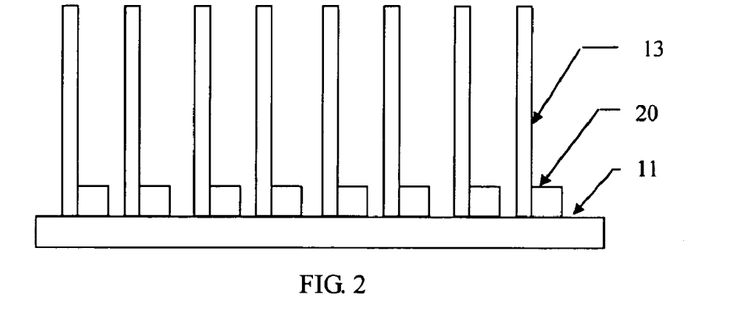
FIG. 2 is a schematic view showing the interconnection relationship between a backplane and circuit boards.

Generally the backplane is passive. That is to say, there is no active element on the backplane, such as various ICs (integrated circuits). Referring to FIG. 1, the power supply for the backplane 11 is provided by a power supply module 16 in the frame 12. The backplane 11 is connected to the power supply module 16 via a power supply connector 15, and the backplane 11 is connected to circuit boards 13 via a power supply connector 14, so that various ICs arranged on the circuit boards 13 are supplied with power. FIG. 2 is a schematic view showing the interconnection relationship between the backplane 11 and the circuit boards 13 via connectors 20, which are formed from the power supply connectors 14 and 15.

With the development of data broadband, digital television and VOD (Video On Demand) services, requirement for system bandwidth is becoming higher, and capacity of the system is becoming larger. Therefore, requirement for supplying high-power current to the backplane is becoming urgent. To achieve this object, it is attained generally in the conventional backplane by adding several layers of integral (or partial) copper sheets in the multilayer circuit boards. However, general high density backplane includes 20 to 30 layers, and the larger the layer number is, the higher the producing cost of the backplanes is. Further, the relationship between the cost increment and the layer number of the backplane is not linear. Rather, the rate of the cost increment is greater than that of the layer number increment. It is obvious that the producing cost of the backplane will be increased by increasing the layer number of the backplane. Another solution is to lay copper partially on the signal plane or to supply power to the divided areas of the ground plane. This solution decreases the wiring space and increases the wiring difficulty, as well as may further generate interfering signals caused by the power supply noise.

To solve the above problems, separated element, such as busbar, located outside of the backplane can be designed to provide large current. Typical busbar serves as a power supplying and grounding system, and includes multiple layers of copper conductors with insulation dielectric therebetween. The busbar is widely applied to the cabinet of a system.

Figure 3:
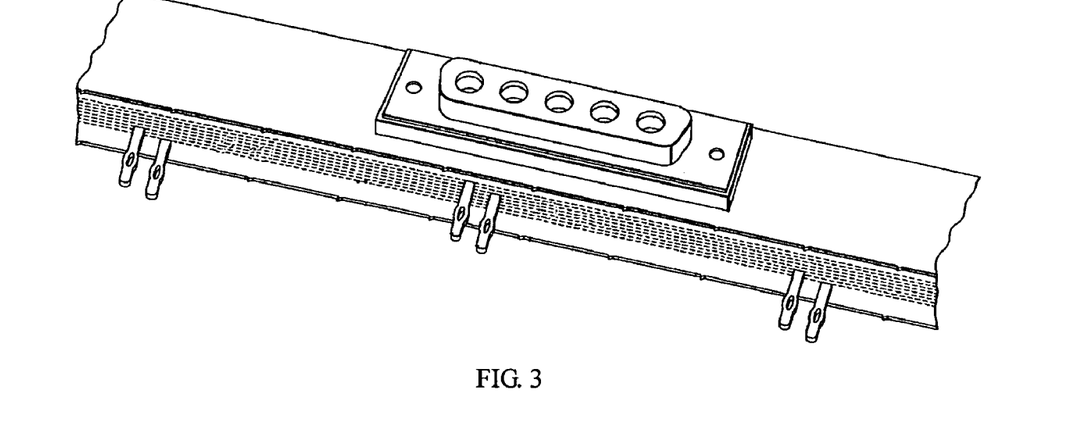
FIG. 3 is a structural plane view showing a press-fitted busbar device for backplane.
Figure 4A:
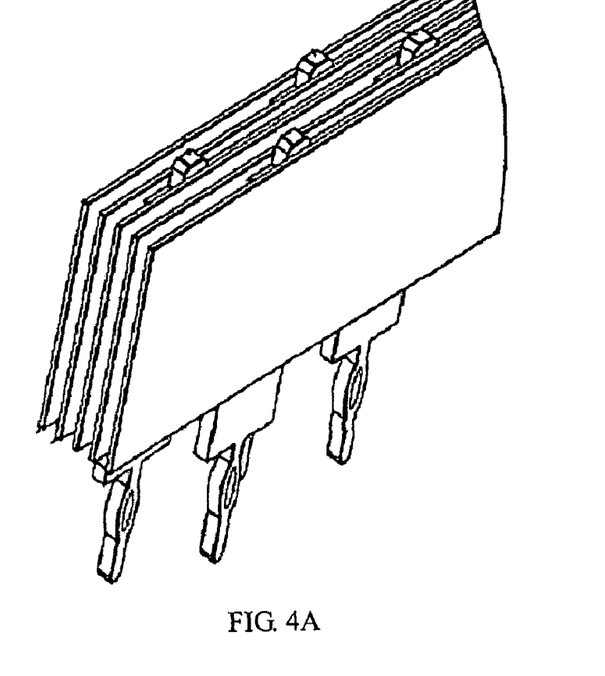
FIG. 4A is a perspective structural view showing the press-fitted busbar device for backplane.
Figure 4B:
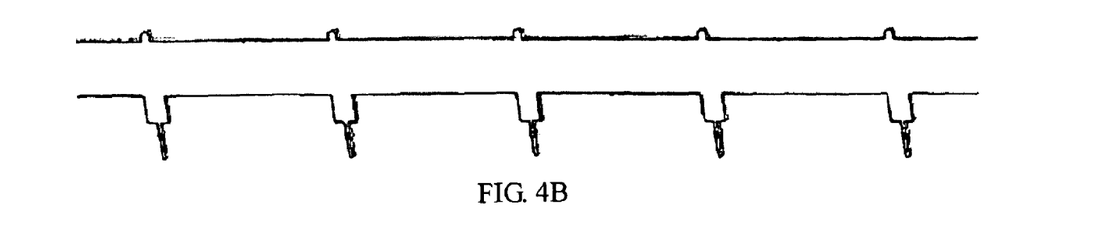
FIG. 4B is a schematic view showing the structure of pins of the press-fitted busbar device for backplane.

Now the above technology is applied to the backplane system. The busbar also includes multiple layers of conductors. However, the difference lies in that some needle type base pins, which are designed to be contacted with conductors and can be mounted on the backplanes by press-fitted process, are provided at a distance on the busbar. This busbar is mounted on the backplane by press-fitted process. The press-fitted base pins are closely contacted with the conductors in large areas. Positional arrangement of the base pins can be customized, depending on requirements of the users. The extra base pins can be removed by applying external force. The press-fitted busbar is shown in FIGS. 3, 4A, and 4B.

1. When applying the busbar in the prior art to the backplane, due to the large size of the backplane, generally a long press-fitted busbar is used to extend through the whole backplane, which may cause the following problems:

(A) Maintenance is inconvenient. Because the long busbar is mounted in a press-fitted manner, the press-fitted base pins are required to be closely contacted with the metallized holes in the backplane, which often causes the base pins to be embedded into the metal of the metallized holes. It is quite difficult to remove this kind of busbar out of the metallized holes.

(B) The mounting holes in the backplanes for mounting the busbar in a press-fitted manner need to be processed in high positional precision; otherwise, there will be accumulative error, which may cause the press-fitted busbar not to be mounted on the backplane correctly. However, the higher the processing precision is, the higher the producing cost of the backplane is.

2. If short press-fitted busbars are used to supply power for the whole backplane, the busbars have to be connected with each other in a certain manner, which increases the complexity of mounting the busbars and degrades the system reliability.

As described above, the above two kinds of press-fitted busbars backplane may also cause the deformation of the backplane, in turn cause stress concentration in the backplane and degrade the long-term reliability of the backplane. Because the backplane for different applications may be made of different materials usually having different thermal expansion coefficients, the material for the busbar may have a different thermal expansion coefficient from that of the backplane. The difference of the thermal expansion coefficient causes the deformation of the backplane, causes stress concentration in the backplane, and degrades the reliability of the backplane.

SUMMARY OF THE INVENTION

One embodiment according to the present invention provides a busbar device, which can be mounted and detached conveniently and will not tend to result in the deformation of the mount device after being assembled. A circuit board mounted with the busbar device is also provided.

A busbar device comprises a conductive body, wherein the conductive body is provided with a number of mounting holes corresponding to the mounting holes of a mount device for mounting the busbar device, the conductive body is a flexible conductive body, and the distance between every two adjacent mounting holes in the conductive body is larger than or equal to the distance between two corresponding adjacent mounting holes in the mount device.

A circuit board comprises a busbar device and a circuit board body, wherein the circuit board body is provided with a plurality of mounting holes; the busbar device comprises a conductive body, the conductive body being provided with a number of mounting holes corresponding to the mounting holes in the circuit board body, the conductive body being a flexible conductive body, and the distance between every two adjacent mounting holes in the conductive body is larger than or equal to the distance between two corresponding adjacent mounting holes in the circuit board body; the corresponding mounting holes in the circuit board body and in the conductive body are fixed by fasteners.

The above busbar device can be detached and maintained conveniently. Because the distance between adjacent mounting holes in the conductive body of the above busbar device is larger than or equal to that of the corresponding mounting holes in the mount device, the mount device will not be deformed after assembled. For above busbar device, it is not required that the mounting holes in the mount device have high precision, thus decreasing the processing difficulty and the producing cost of the mount device.

DETAILED DESCRIPTION OF THE INVENTION

First Embodiment

The busbar device according to the embodiment of the present invention is a separate component as a power supply and grounding apparatus for supplying large current to outside of PCB. The busbar device according to the embodiment is mounted on the backplane through mounting holes, so that the working grounding current flowing through various parts of the cabinet of a system can be electrically connected to the busbar device, and then joined to the safe grounded portion of the cabinet of the system at appropriate position so as to be connected to the ground wire of the cabinet (in a manner of being grounded at one point). The busbar device functions as a grounding device for supplying large current to outside of PCB.

Figure 5:
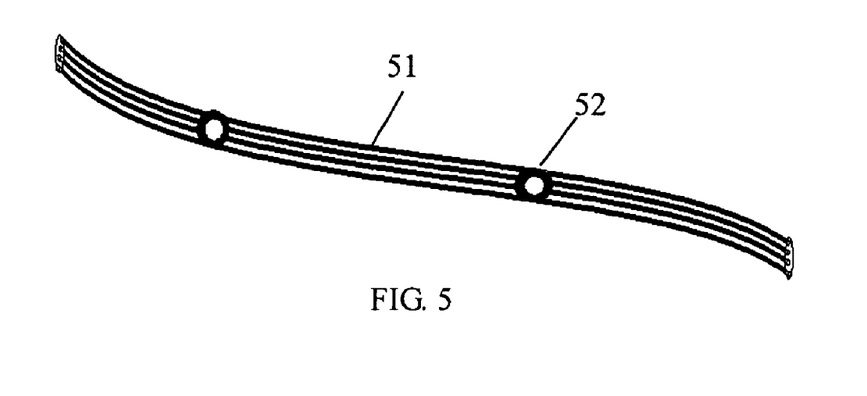
FIG. 5 is a structural schematic view showing a busbar device, including a flexible cable, according to an embodiment of the present invention.

In the cabinet of the system, the busbar device is mounted on the backplane having a plurality of mounting holes. As shown in FIG. 5, the busbar device includes a conductive body 51. The conductive body 51 has a plurality of mounting holes 52, and the distance between every two adjacent mounting holes 52 is longer than or equal to the distance between two corresponding adjacent mounting holes in the backplane 11.

The conductive body 51 of the busbar device according to the embodiment of the present invention may be a flexible body. In the present embodiment, the conductive body 51 is a flexible cable (which comprises a plurality of thin wires, such as copper wires). The flexible cable may be a plurality of parallel cables or a braided flat cable, or the like. The conductors in the cable are fixed together at a distance on the conductive body 51. In the present embodiment, the conductors in the cable can be fixed by welding, and the fixed-together parts of the conductors in the cable are designed to a specific shape (such as the shape like a round pad). A plurality of mounting holes 52 are arranged in the areas of the fixed-together parts. The busbar device according to the embodiment of the present invention refers to the conductive body provided a plurality of mounting holes 52 to the areas of the fixed-together parts. The mounting holes 52 in the conductive body 51 may be round, polygonal, elliptical, or obround shapes. The distance between every two adjacent mounting holes among the plurality of the mounting holes 52 provided in the conductive body 51 is longer than that between two corresponding adjacent mounting holes in the backplane 11, in order to ensure that no stress exists in the conductive body of the mounted busbar device, and ensure that the backplane 11 will not be deformed.

Figure 6A:
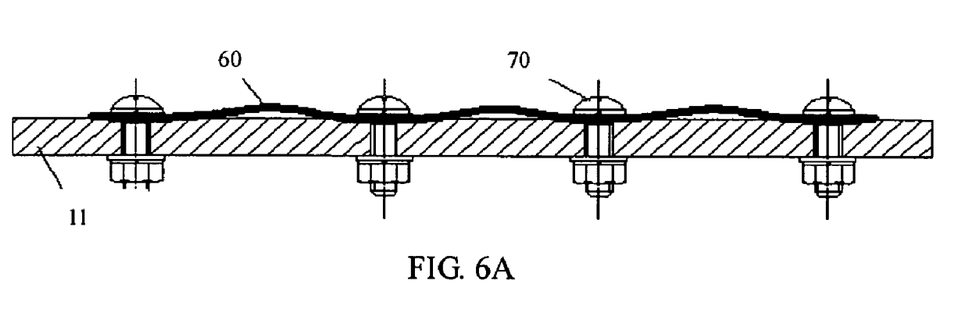
FIG. 6A and FIG. 6B are structural schematic views showing the mount of the busbar device, including the flexible cable, according to the embodiment of the present invention.
Figure 6B:
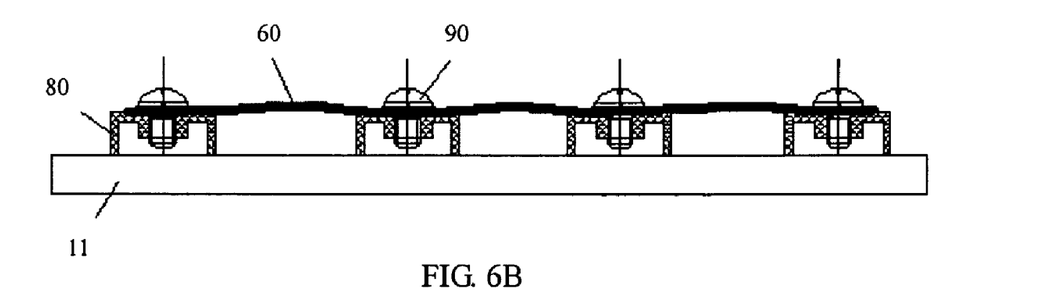

As shown in FIG. 6A, a flexible busbar device 60 is fixed on the backplane 11 by screw fastening assemblies 70 through the mounting holes both in the flexible busbar device 60 and in the backplane 11. Or as shown in FIG. 6B, sockets 80 are assembled on the backplane 11, and the flexible busbar device 60 according to the embodiment of the present invention is fixed on the sockets 80 by fasteners 90 (such as screws or sockets). The sockets 80 may include press-fitted nuts, press-fitted sockets, or welded sockets, etc.

In addition, to ensure safety of a system, the conductive body 51 can be covered with an insulation layer after the busbar device is mounted on the backplane.

Thus, the configured busbar device of the present embodiment can be mounted on the backplane through the mounting holes in the conductive body, so that it is convenient to be mounted and detached in use, and the backplane will not be deformed after assembled, nor are the mounting holes in the backplane required to improve their precision, which decreases the processing difficulty and producing cost of the backplane. The embodiment according to the present invention may be applied to not only the backplane in a system but also various circuit boards requiring large current.

Second Embodiment

Figure 7A:
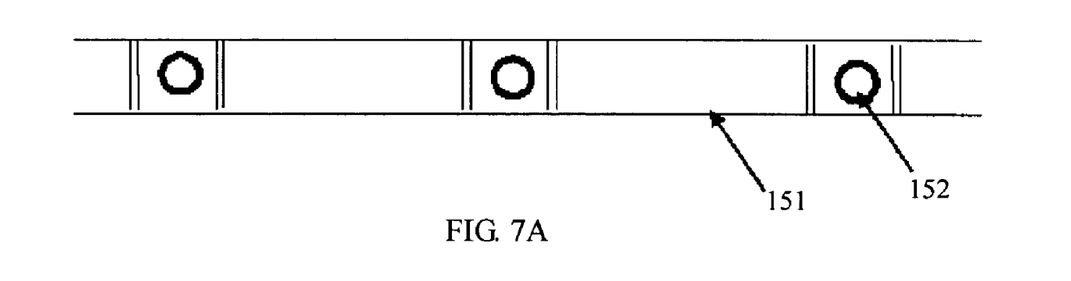
FIG. 7A and FIG. 7B are structural schematic views showing a busbar device, including sheet metal, according to another embodiment of the present invention.
Figure 7B:
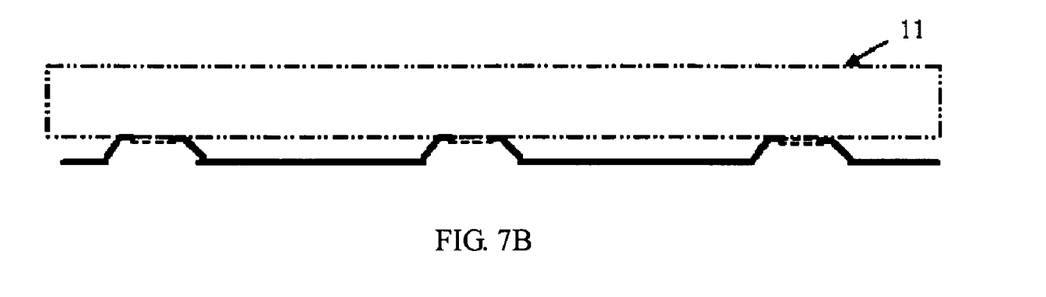

The present embodiment has the same structure as the first embodiment, except that the conductive body 151 of the second embodiment can also include one layer or multiple layers of sheet metal(s) with certain flexibility and thickness. The conductive body 151 is provided with a plurality of mounting holes 152, as shown in FIGS. 7A and 7B.

The busbar device in the present embodiment can also be mounted on the backplane 11 or other circuit boards requiring large current in the same manner as that of the first embodiment, so the description thereof is omitted. The present embodiment has the following advantages. Manufacturing process of the busbar device is simple. It is also ensured that the busbar device has certain flexibility. After the busbar device is mounted, the backplane 11 will not be deformed due to thermal expansion of the backplane 11, and the busbar device is convenient to be detached.

Third Embodiment

Figure 8:
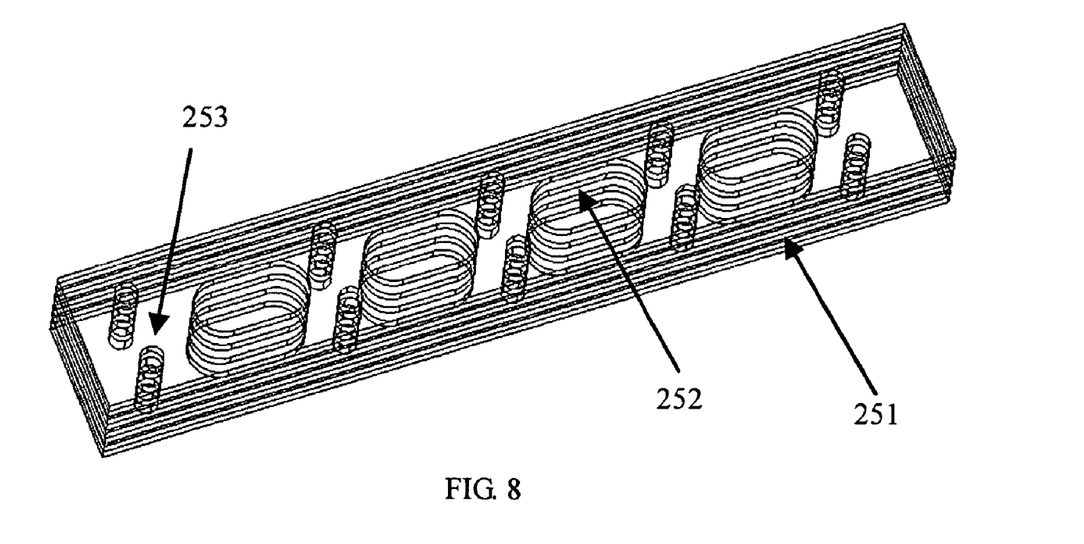
FIG. 8 is a structure schematic view showing a busbar device, including PCBs, according to still another embodiment of the present invention.

The present embodiment has the same structure as the above both embodiments, except that the conductive body 251 in the present embodiment may include one layer or multiple layers of PCB(s). Mounting holes 252 are arranged at a distance in the conductive body 251, as shown in FIG. 8, specifically. In the present embodiment, if the PCB forming the conductive body 251 includes multiple layers, the multilayer PCB is provided with metallized holes 253 through which the multilayer PCB is connected.

In the present embodiment, the thickness of the copper sheet provided in the multilayer PCB may be thickened as required. The insulation material in the structure of the PCB may be same as or different from that of the backplane. However, the insulation material in the structure of the PCB is required to have same thermal expansion coefficient as that of the backplane, to ensure that the backplane will not be deformed after assembled.

In addition, in the present embodiment, the mounting holes 252 in the conductive body 251 of the busbar device may be larger in size than the mounting holes for receiving bolts in the backplane, in particular the mounting holes in the busbar device are wider in the longitudinal direction of the busbar device than that of the backplane. As shown in FIG. 8, the mounting holes in the busbar device may be formed as obround shape, so that the excessively high precision requirement for the mounting holes in the backplane 11 are avoided. The description of the first embodiment may be referred for the mounting manner of the present embodiment.

The present invention further provide a circuit board utilizing the busbar device according to the above three embodiments. The circuit board includes a busbar device and a circuit board body for mounting the busbar device. The busbar device includes a conductive body provided with a plurality of mounting holes. The circuit board body is provided with a plurality of mounting holes. The mounting holes in the circuit board body and the mounting holes in the conductive body are fixed by fasteners. In the present embodiment, in fact, when mounting the busbar device, the flexible cable or sheet metal employed may also be mounted on the backplane by skipping a mounting hole and using two mounting holes at both sides of the skipped mounting hole. However, this will result in a waste of material of the busbar device and it is not a preferred solution. The preferred solution is that the distance between every two adjacent mounting holes in the conductive body is larger than or equal to that between two corresponding adjacent mounting holes in the circuit board body. The description of the above three embodiments may be referred for the mounting structure thereof.

As described above, the busbar device according to the embodiments of the present invention overcomes the defects in the prior art. The busbar device for backplane according to the embodiments of to the present invention may be extended through the whole backplane, and are convenient to be detached and maintained. Because the distance between the adjacent mounting holes in the backplane is smaller than that between the mounting holes in the conductive body of the busbar device and the cable itself has flexibility, the mount of the busbar device will not result in the deformation of the backplane. It does not require high precision for the mounting holes in the PCB (the backplane), thus decreasing processing difficulty and producing cost of the backplane.

It is apparent to those skilled in the art that various changes and modifications may be made to the present invention without departing from the spirit and scope of the invention. Thus, it is intended to include the various changes and modifications fall within the scope of the appended claims and the equivalents thereof.

What is claimed is:

1. A circuit board comprising a busbar device and a circuit board body, wherein,
    the circuit board body is provided with a plurality of mounting holes;
    the busbar device comprises a conductive body, a conductor of the conductive body having a number of mounting holes corresponding to the mounting holes in the circuit board body, the conductive body being a flexible conductive body, and the distance between every two adjacent mounting holes in the conductive body is larger than or equal to the distance between two corresponding adjacent mounting holes in the circuit board body;
    the corresponding mounting holes in the circuit board body and in the conductive body are fixed by fasteners;
    the mounting holes in the conductor are arranged in a longitudinal direction of the conductor, when the busbar device is mounted on the circuit board body, whereby the busbar device is spread out on the surface of the circuit board body.

2. The circuit board according to claim 1, wherein the flexible conductive body is a flexible cable, or at least one layer of flexible sheet metal.

3. The circuit board according to claim 2, wherein the flexible cable comprises a plurality of parallel cables or a braided flat cable, and the flexible cable is fixedly connected at the mounting holes in the conductive body.

4. The circuit board according to claim 1, wherein the Printed Circuit Board comprises multiple layers, and the multilayer Printed Circuit Board is provided with metallized holes and connected through the metallized holes.

5. The circuit board according to claim 4, wherein the mounting holes in the Printed Circuit Board are longer than the corresponding mounting holes in the circuit board body in a longitudinal direction of the busbar device.

6. A communication equipment comprising:
    a cabinet; and
    at least one circuit board mounted in the cabinet;
    wherein at least one circuit board comprises a busbar device and a circuit board body,
    the circuit board body is provided with a plurality of mounting holes;
    the busbar device comprises a conductive body, a conductor of the conductive body having a number of mounting holes corresponding to the mounting holes in the circuit board body, the conductive body being a flexible conductive body, and the distance between every two adjacent mounting holes in the conductive body is larger than or equal to the distance between two corresponding adjacent mounting holes in the circuit board body;
    the corresponding mounting holes in the circuit board body and in the conductive body are fixed by fasteners;
    the mounting holes in the conductor are arranged in a longitudinal direction of the conductor, when the busbar device is mounted on the circuit board body, whereby the busbar device is spread out on the surface of the circuit board body.

7. The communication equipment according to claim 6, wherein the conductive body is a flexible cable comprising a plurality of parallel cables or a braided flat cable, and the flexible cable is fixedly connected at the mounting holes in the conductive body.

8. The communication equipment according to claim 6, wherein the Printed Circuit Board comprises multiple layers, and the multilayer Printed Circuit Board is provided with metallized holes and connected through the metallized holes.

9. The communication equipment according to claim 6, wherein the mounting holes in the Printed Circuit Board are longer than the corresponding mounting holes in the circuit board body in a longitudinal direction of the busbar device.

* * * * *